(12) United States Patent
Karrer et al.

(10) Patent No.: US 7,272,015 B2
(45) Date of Patent: Sep. 18, 2007

(54) ELECTRONIC UNIT WITH EMC SHIELDING

(75) Inventors: Volker Karrer, Regensburg (DE); Michael Kirchberger, Neutraubling (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/328,578

(22) Filed: Jan. 10, 2006

(65) Prior Publication Data

US 2006/0152912 A1 Jul. 13, 2006

(30) Foreign Application Priority Data

Jan. 10, 2005 (DE) ............ 10 2005 001 148

(51) Int. Cl.
*H01R 12/16* (2006.01)
(52) U.S. Cl. .......... 361/790; 361/702; 174/15.1; 174/252; 174/548; 257/706; 257/733
(58) Field of Classification Search ............ 361/140, 361/142, 679–720, 784–790; 174/15.1, 252, 174/548; 257/706–733
See application file for complete search history.

(56) References Cited

U.S. PATENT DOCUMENTS

| | | | | |
|---|---|---|---|---|
| 4,858,073 A | * | 8/1989 | Gregory | 361/708 |
| 5,590,026 A | * | 12/1996 | Warren et al. | 361/704 |
| 5,930,116 A | * | 7/1999 | Palmer | 361/704 |
| 6,058,013 A | * | 5/2000 | Christopher et al. | 361/704 |
| 6,154,369 A | * | 11/2000 | Martinez et al. | 361/719 |
| 6,219,245 B1 | * | 4/2001 | Nagashima et al. | 361/705 |
| 6,778,388 B1 | * | 8/2004 | Minelli | 361/690 |
| 6,900,990 B2 | * | 5/2005 | Tomioka | 361/752 |
| 2005/0047101 A1 | * | 3/2005 | Osanai | 361/760 |
| 2005/0083665 A1 | * | 4/2005 | Nakashima et al. | 361/767 |

FOREIGN PATENT DOCUMENTS

DE 198 59 739 A1 7/2000
DE 103 16 449 A1 10/2004

* cited by examiner

*Primary Examiner*—Dean A. Reichard
*Assistant Examiner*—Xiaoliang Chen
(74) *Attorney, Agent, or Firm*—Laurence A. Greenberg; Werner H. Stemer; Ralph E. Locher

(57) ABSTRACT

To improve EMC shielding for an electronic unit containing at least one electronic power device operated at high frequency and a metal housing thermally coupled to the device to provide heat dissipation, the power device with a device terminal is thermally and electrically coupled to a first metal plate. The first metal plate is coupled in turn to a second metal plate in a particular manner via a first insulating layer. A metal housing with a heat sink through which a cooling fluid can flow is disposed, on another side of a second insulating layer. The improvement in EMC is based on an internal short-circuiting of an interference current produced by the power device over a very short loop.

42 Claims, 2 Drawing Sheets

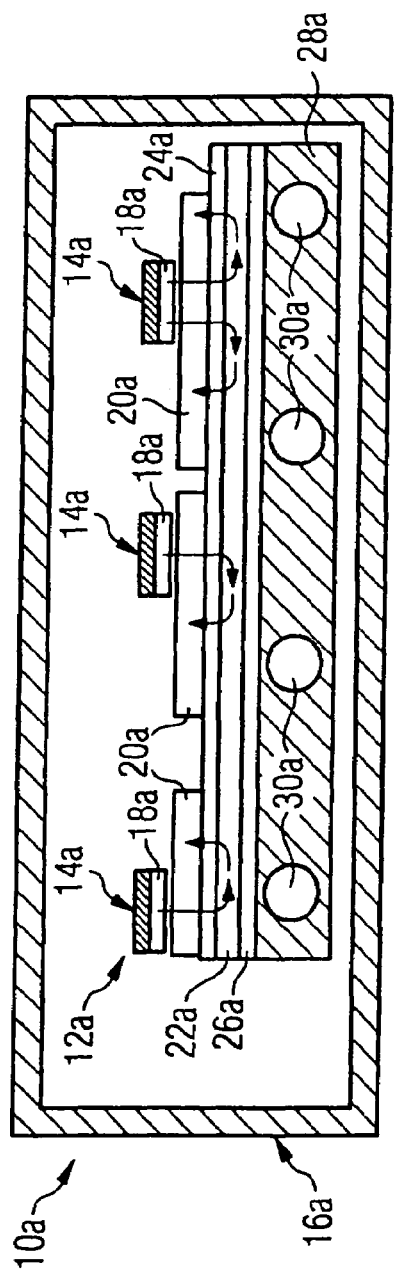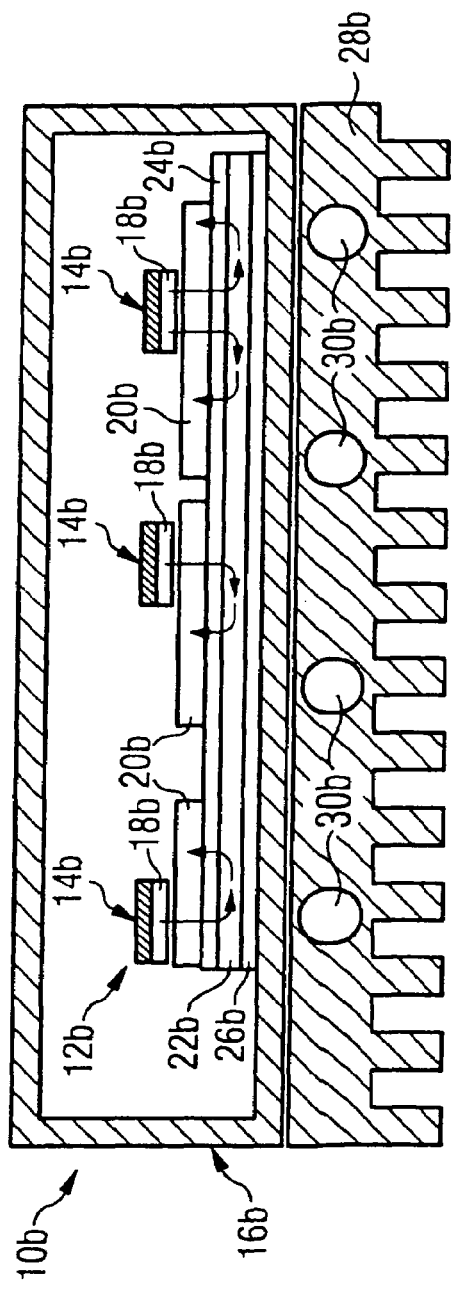

ELECTRONIC UNIT WITH EMC SHIELDING

BACKGROUND OF THE INVENTION

Field of the Invention

The present invention relates to an electronic unit having at least one electronic power device operated at high frequency and a metal housing thermally coupled to the device for heat dissipation.

Electronic units of this kind are used in many areas, the metal housing serving primarily to protect the electronic circuit configuration accommodated therein and to dissipate the heat produced by losses. In addition, a metal housing is also a known measure for shielding for electromagnetic radiation. Under the last aspect, the metal housing of the known electronic unit improves the electromagnetic compatibility (EMC) of the electronic unit, bearing in mind that the electronic device operated at high frequency constitutes a potential source of electromagnetic interference.

In many applications it has been found that the EMC of the known electronic units or electronic devices can no longer meet the now more stringent requirements. This applies particularly to areas in which both the metal housing and the electronics accommodated therein are particularly sophisticated (e.g. in respect of the electric powers, operating frequencies, etc.) and/or the electronics together with the metal housing must be manufactured particularly inexpensively. The problem of inadequate EMC is also of particular importance if a plurality of electronic devices have to be operated in a confined space in more or less immediate proximity to one another, as may be the case e.g. for vehicle electronics components.

SUMMARY OF THE INVENTION

It is accordingly an object of the invention to provide an electronic unit with EMC shielding which overcomes the above-mentioned disadvantages of the prior art devices of this general type, which has good EMC shielding that can be provided in a simple manner.

With the foregoing and other objects in view there is provided, in accordance with the invention, an electronic unit. The electronic units contains at least one electronic power device operated at high frequency and has a flat, bare device terminal; a metal housing thermally coupled to the electronic power device; and a first metal plate having a first flat side and a second flat side. The flat, bare device terminal is thermally and electrically attached in a planarly stacked manner to the first flat side of the first metal plate. The first metal plate has larger dimensions than the electronic power device. Electrically insulating first and second insulating layers are provided. A second metal plate is thermally attached in a planarly stacked manner via the electrically insulating first insulating layer to the second flat side of the first metal plate. The second metal plate is dimensioned at least as large as the first metal plate. A metal housing is disposed on and thermally attached to a flat side of the second metal plate facing away from the first metal plate via the electrically insulating second insulating layer. The metal housing functions as a metal heat sink through which a cooling fluid can flow.

For the invention it is first important for the high-frequency operated electronic power device with a flat, bare device terminal to be thermally attached in a planarly stacked manner to a first metal plate, so that so-called horizontal heat spreading, known per se, occurs at this point. This creates the basis for improved performance characteristics of the electronic unit which can be, for example, a controller with power output stage in the electronics of a motor vehicle. In particular the thermal attachment can handle e.g. the high thermal power dissipation of switching transistors which are operated at comparatively high switching frequencies. A "high frequency" within the meaning of the invention occurs in any case when the frequency is greater than 10 kHz, specifically at least 50 kHz. It is further fundamental to the invention that the bare device terminal is also electrically attached to the first metal plate and a second metal plate is disposed in a particular manner with respect to the first metal plate and with respect to the metal housing. In addition, a heat sink through which a coolant fluid can flow is disposed in a particular manner, thereby enabling a high degree of electrical performance and at the same time good EMC shielding to be achieved in a simple manner for the electronic unit. The EMC improvement is based on the fundamental idea of internally short-circuiting the interference current (particularly e.g. high-frequency interference current) produced by the power device over a very short loop, thereby even preventing interfering radiation close to the power device. Although the interference produced by the power device is initially distributed over the first metal plate and capacitively transferred via a first insulating layer to the underlying second metal plate, feedback of the interference takes place over a short path via capacitive coupling from the second metal plate back to the first metal plate. Any residual interference still remaining can be effectively eliminated by the metal housing disposed beneath and a metal heat sink, thereby enabling the electronics unit to be operated with high electrical performance with at the same time good EMC shielding.

In one embodiment it is provided that the electronic unit contains an output stage for controlling an electric drive, e.g. constituting a controller for controlling an asynchronous motor. With the configuration according to the invention, a controller of this kind can also be implemented for drives with comparatively high drive power, it being easily possible to include e.g. a DC/DC converter (e.g. switching regulator) in the circuit arrangement of the electronics unit. Conceivable applications for this use of the electronic unit are e.g. control devices for electric drives which are provided in a motor vehicle for operation in conjunction with an internal combustion engine (e.g. gasoline or diesel engine). For example, the control of a starter motor or an assist motor (e.g. in a so-called hybrid vehicle) can be implemented. An electric drive of this kind can be disposed e.g. in the powertrain of the vehicle in question.

A preferred use of the electronics unit is for providing a maximum electric output power of more than 5 kW.

The electronic power device can be a power semiconductor device, in particular a MOSFET. For such components the problems of heat dissipation and EMC are particularly significant, especially if they are operated in switched mode, e.g. as switching transistors in a power output stage.

In a preferred embodiment the first metal plate and/or the second metal plate have a thickness of at least 1 mm, thereby enabling even a particularly high interference current to be short-circuited very effectively (low impedance).

It is further preferable for the first metal plate to be dimensioned more than twice as large as the device terminal, the term "dimensioning" here meaning the planar extent (orthogonal to the thickness).

In a preferred embodiment the first metal plate is held at a predetermined potential during operation of the electronics unit, i.e. is integrated in the electronic circuit arrangement. The potential can be e.g. a supply potential which can be fixed (e.g. a ground potential or a positive or negative supply potential). In conjunction with the first metal plate which is implemented larger than the device terminal, this has the advantage, for example, that the first metal plate can be used for contacting other electronic devices, in particular for contacting other electronic power devices of the above mentioned type. The first metal plate can then play an important role in internally short-circuiting interference currents emanating from a plurality of electronic power devices.

The first and/or the second insulating layer can, for example, incorporate a plastic foil or consist of a plastic foil.

The second metal plate can also be held at a predetermined potential during operation of the electronics unit. This can be, for example, a fixed supply potential, in particular e.g. a ground potential. In one embodiment it is provided that both the first metal plate and the second metal plate are held at a fixed ground or supply potential in each case, the two potentials being different from one another.

Above all, with regard to the arrangement of the heat sink through which a cooling fluid flows, it is advantageous if the second insulating layer is at least partially constituted by air, thereby creating greater constructional freedom for designing the heat sink and corresponding inflow and outflow lines for the cooling fluid.

In one embodiment it is provided that the metal housing of the electronics unit is designed for electrical attachment to a metal chassis, e.g. the bodywork of a motor vehicle. This electrical attachment to a chassis is unproblematic within the scope of the invention, as the interference or parasitic currents are already intercepted or short-circuited inside the housing.

Other features which are considered as characteristic for the invention are set forth in the appended claims.

Although the invention is illustrated and described herein as embodied in an electronic unit with EMC shielding, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic, sectional view of a second embodiment of the electronic unit according to the invention; and FIG. 4 is a diagrammatic, sectional view of a third embodiment of the electronic unit according to the invention.

DESCRIPTION OF THE PREFERRED EMBODIMENTS

Figure 1:
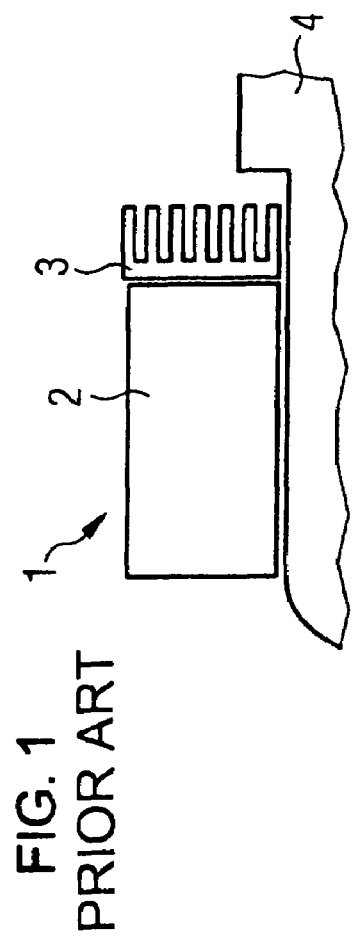
FIG. 1 is a diagrammatic illustration of an electronic unit disposed on a metal chassis according to the prior art.

Referring now to the figures of the drawing in detail and first, particularly, to FIG. 1 thereof, there is shown a known per se arrangement of an electronic unit 1 formed of a housing body 2 containing an electronic circuit configuration and a passive cooler 3 thermally attached thereto, which is fixed (e.g. screwed) onto a metal chassis 4.

If the electronic circuit configuration contained in the housing body 2 is a source of electronic interfering radiation, there is a risk of interference to other electronic devices disposed in the vicinity of the electronic unit 1. In practice this problem is increased by the presence of the cooler 3 and the attachment to the chassis 4, as the latter component often acts as an "antenna" or transmission line for such interfering radiation, also bearing in mind that even with a metal housing 2, its so-called "Faraday cage" effect is often inadequate due to cutouts and/or relatively thin walls for reasons of cost.

Figure 2:
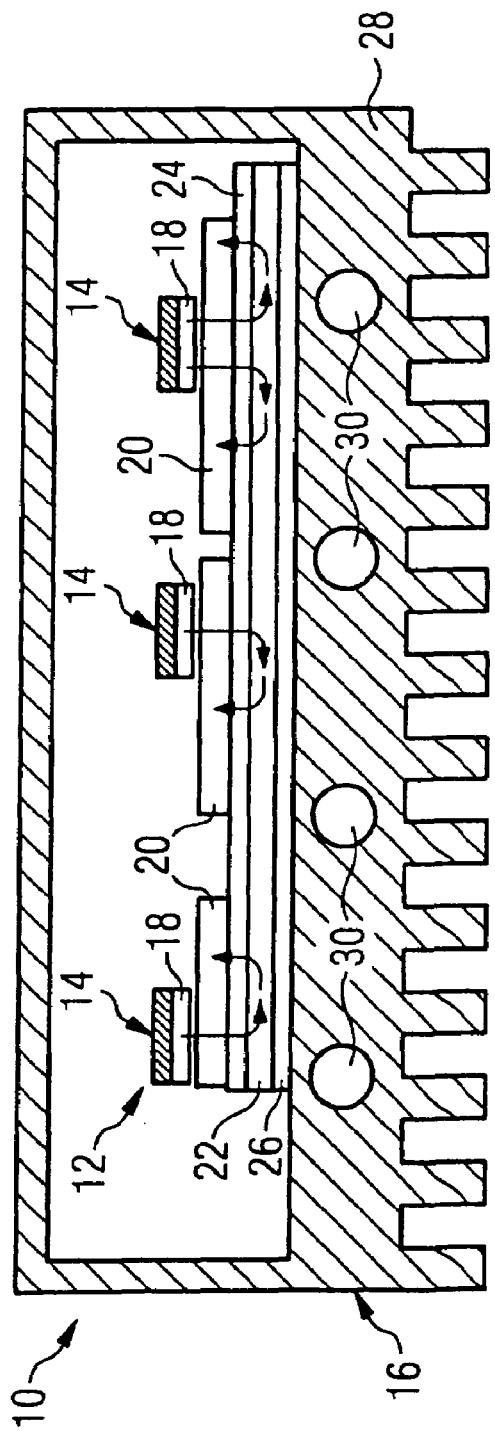
FIG. 2 is a diagrammatic, sectional view of a first embodiment of the electronic unit according to the invention.

FIG. 2 schematically illustrates an electronic unit with improved EMC characteristics in the form of a controller 10 for controlling an electric drive in a motor vehicle.

The controller 10 has an electronic circuit configuration 12 with at least one electronic power device which is operated at high frequency during operation of the controller 10 and therefore acts as a potential source of interference. In the example shown, three such power devices in the form of MOSFETs, labeled 14, are visible in the FIG. 2.

To dissipate the heat produced by losses in the MOSFETs 14, they are thermally coupled, as will be described below, to a one-piece or multipiece metal housing 16 which protects the circuit configuration 12 contained therein and is provided with fixing device for fixing the controller 10 to a bodywork section of the relevant vehicle.

Each MOSFET 14, as a so-called "bare die" with a flat, bare metal device terminal 18, is thermally and electrically attached in a planarly stacked manner to an upper flat side of a first metal plate 20 via a conductive adhesive coating. In the example shown, it is the drain terminal that is connected in this manner to the first metal plate 20 serving as an output terminal or supply terminal.

The other terminals of the MOSFETs 14 as well as the terminals of other non-illustrated electronic devices can be contacted in a per se known manner, e.g. to a circuit board or a ceramic substrate provided with conductor tracks. Such boards or substrates (not shown in FIG. 2) can be disposed e.g. approximately at the level of the metal regions 20 and/or 22 shown. The metal regions 20 and/or 22 can be provided separately or even as an integral part of such boards or substrates. Depending on the circuit layout, individual additional device terminals can of course be contacted directly on the metal layers 20 and/or 22.

Under each first metal plate 20, a second metal plate 22 is thermally attached in a planar manner via an electrically insulating first plastic foil 24 to a flat underside of the first metal plates 20. In the example shown, a single such second metal plate 22 is provided jointly for the first three metal plates 20. Alternatively, separate second metal plates 22 could also be provided for individual or a plurality of first metal plates 20.

For particularly effective feedback of RF interference produced by the MOSFETs 14 during operation, it is important that the first metal plates 20 have a larger surface area than the device 14 overlying them and that the first metal plate 20 is overlapped area-wise by the material of the second metal plate(s) 22. Therefore any such RF interference is short circuited over a short path implemented inside the housing 16 (see the arrows in FIG. 2).

The RF interference produced by the MOSFET 14 is coupled via the underlying first metal plate 20 and the (parasitic) capacitance of the first plastic foil 24 to the second metal plate 22 used here e.g. as a grounding plate, and is fed back again via the same mechanism because of the more or less large-area overlapping of the two metal plates 20, 22.

The metal plates 20, 22 must be made sufficiently thick in order to short-circuit with high impedance the in some cases very high RF interference currents. In the example shown the first metal plates 20 are approximately 1 mm thick-and the second metal plate 22 is approximately 1.5 mm thick.

In order to prevent direct transfer of an interference current to the housing 16 with nevertheless good thermal coupling between the planar metal plate sandwich 20, 22 and the housing 16, the housing 16 is disposed on and thermally attached to the underside of the second metal plate 22 via an electrically insulating second plastic foil 26.

A section (e.g. floor) of the housing 16 located in this region forms a heat sink 28 through which cooling fluid flows and which finally passes the heat dissipated from the electronic circuit configuration 12 to the cooling fluid and, by cooling fins, to the environment. Corresponding cooling fluid ducts 30 are shown by way of example in the FIG. 2.

Like the second metal plate 22, the housing 16 can also be electrically referred to ground. It acts as additional shielding. A portion of the RF interference, which has not already been fed back via the ground plate 22, is then additionally shielded by the housing 16 which is made particularly thick at this point. Any RF interference current on the housing 16 is thus considerably reduced, in spite of the good heat dissipation capability of the above explained configuration of the metal plates 20 and 22. This makes it possible in particular for the housing 16, e.g. in the manner explained with reference to FIG. 1, to be directly connected electrically to a metal chassis without transferring appreciable interference currents to the chassis.

To summarize, interference currents are short-circuited over the shortest possible path and at low impedance, the improved EMC shielding also having an advantageous effect in respect of the remaining electronic components of the circuit configuration 12.

In the following description of further examples, the same reference numerals will be used for equivalent components, with the addition in each instance of a lower-case letter to differentiate the embodiment. Essentially only the differences compared to the example(s) already described will be examined in detail and otherwise reference should be made explicitly to the description of previous examples.

FIG. 3 shows another embodiment of an electronic unit 10*a* in which a heat sink 28*a* through which a cooling fluid can flow is disposed between a second metal plate 22*a* and a metal housing 16*a* as a separate unit.

FIG. 4 shows a further embodiment of an electronic unit 10*b* in which a heat sink 28*b* is disposed on the outside of a metal housing 16*b* as a separate unit.

This application claims the priority, under 35 U.S.C. § 119, of German patent application No. 10 2005 001 148.9, filed Jan. 10, 2005; the entire disclosure of the prior application is herewith incorporated by reference.

We claim:

1. An electronic unit, comprising:
   at least one electronic power device operated at high frequency and having a flat, bare device terminal;
   a first metal plate having a first flat side and a second flat side, said flat, bare device terminal thermally and electrically attached in a planarly stacked manner to said first flat side of said first metal plate, said first metal plate being of larger dimensions than said electronic power device, said flat, bare device terminal being directly conductively connected to said first flat side of said first metal plate;
   an electrically insulating first insulating layer;
   a second metal plate thermally attached in a planarly stacked manner via said electrically insulating first insulating layer to said second flat side of said first metal plate, said second metal plate being dimensioned at least as large as said first metal plate;
   an electrically insulating second insulating layer; and
   a metal housing disposed on and thermally attached to a flat side of said second metal plate facing away from said first metal plate via said electrically insulating second insulating layer, said metal housing functioning as a metal heat sink through which a cooling fluid can flow, said metal housing having fluid ducts formed therein for conducting the cooling fluid and functioning as a cooling fluid based heat sink.

2. The electronic unit according to claim 1, further comprising an output stage for controlling an electric drive.

3. The electronic unit according to claim 1, wherein the electronic unit has a maximum electrical output power of more than 5 kW.

4. The electronic unit according to claim 1, wherein said electronic power device is a MOSFET.

5. The electronic unit according to claim 1, wherein said first metal plate is at least 1 mm thick.

6. The electronic unit according to claim 1, wherein said first metal plate is dimensioned more than twice as large as said device terminal.

7. The electronic unit according to claim 1, wherein said first metal plate is held at a first supply potential during operation of the electronic unit.

8. The electronic unit according to claim 1, wherein said electrically insulating first insulating layer has a plastic foil.

9. The electronic unit according to claim 1, wherein said second metal plate is at least 1 mm thick.

10. The electronic unit according to claim 1, wherein said second metal plate is held at a second supply potential, being a fixed ground potential, during operation of the electronic unit.

11. The electronic unit according to claim 1, wherein said electrically insulating second insulating layer has a plastic foil.

12. The electronic unit according to claim 1, wherein said electrically insulating second insulating layer is at least partially constituted by air.

13. The electronic unit according to claim 1, wherein said metal housing is configured for electrical attachment to a metal chassis.

14. The electronic unit according to claim 13, wherein the metal chassis is a metal bodywork of a motor vehicle.

15. An electronic unit, comprising:
    at least one electronic power device operated at high frequency and having a flat, bare device terminal;
    a first metal plate having a first flat side and a second flat side, said flat, bare device terminal thermally and electrically attached in a planarly stacked manner to said first flat side of said first metal plate, said first metal plate being of larger dimensions than said electronic power device, said flat, bare device terminal being directly conductively connected to said first flat side of said first metal plate;
    an electrically insulating first insulating layer;
    a second metal plate thermally attached in a planarly stacked manner via said electrically insulating first insulating layer to said second flat side of said first metal plate, said second metal plate being dimensioned at least as large as said first metal plate;

an electrically insulating second insulating layer;

a metal housing disposed on and thermally attached to a flat side of said second metal plate facing away from said first metal plate via said electrically insulating second insulating layer; and a metal heat sink through which a cooling fluid can flow, said metal heat sink disposed between said second metal plate and said metal housing and electrically connected to said second metal plate or said metal housing.

16. The electronic unit according to claim 15, further comprising an output stage for controlling an electric drive.

17. The electronic unit according to claim 15, wherein the electronic unit has a maximum electrical output power of more than 5 kW.

18. The electronic unit according to claim 15, wherein said electronic power device is a MOSFET.

19. The electronic unit according to claim 15, wherein said first metal plate is at least 1 mm thick.

20. The electronic unit according to claim 15, wherein said first metal plate is dimensioned more than twice as large as said device terminal.

21. The electronic unit according to claim 15, wherein said first metal plate is held at a first supply potential during operation of the electronic unit.

22. The electronic unit according to claim 15, wherein said electrically insulating first insulating layer has a plastic foil.

23. The electronic unit according to claim 15, wherein said second metal plate is at least 1 mm thick.

24. The electronic unit according to claim 15, wherein said second metal plate is held at a second supply potential, being a fixed ground potential, during operation of the electronic unit.

25. The electronic unit according to claim 15, wherein said electrically insulating second insulating layer has a plastic foil.

26. The electronic unit according to claim 15, wherein said electrically insulating second insulating layer is at least partially constituted by air.

27. The electronic unit according to claim 15, wherein said metal housing is configured for electrical attachment to a metal chassis.

28. The electronic unit according to claim 27, wherein the metal chassis is a metal bodywork of a motor vehicle.

29. An electronic unit, comprising:

at least one electronic power device operated at high frequency and having a flat, bare device terminal;

a first metal plate having a first flat side and a second flat side, said flat, bare device terminal thermally and electrically attached in a planarly stacked manner to said first flat side of said first metal plate, said first metal plate being of larger dimensions than said electronic power device, said flat, bare device terminal being directly conductively connected to said first flat side of said first metal plate;

an electrically insulating first insulating layer;

a second metal plate thermally attached in a planarly stacked manner via said electrically insulating first insulating layer to said second flat side of said first metal plate, said second metal plate being dimensioned at least as large as said first metal plate;

an electrically insulating second insulating layer;

a metal housing disposed on and thermally attached to a flat side of said second metal plate facing away from said first metal plate via said electrically insulating second insulating layer; and a metal heat sink through which a cooling fluid can flow, said metal heat sink disposed on an outside of said metal housing and electrically connected to said metal housing.

30. The electronic unit according to claim 29, further comprising an output stage for controlling an electric drive.

31. The electronic unit according to claim 29, wherein the electronic unit has a maximum electrical output power of more than 5 kW.

32. The electronic unit according to claim 29, wherein said electronic power device is a MOSFET.

33. The electronic unit according to claim 29, wherein said first metal plate is at least 1 mm thick.

34. The electronic unit according to claim 29, wherein said first metal plate is dimensioned more than twice as large as said device terminal.

35. The electronic unit according to claim 29, wherein said first metal plate is held at a first supply potential during operation of the electronic unit.

36. The electronic unit according to claim 29, wherein said electrically insulating first insulating layer has a plastic foil.

37. The electronic unit according to claim 29, wherein said second metal plate is at least 1 mm thick.

38. The electronic unit according to claim 29, wherein said second metal plate is held at a second supply potential, being a fixed ground potential, during operation of the electronic unit.

39. The electronic unit according to claim 29, wherein said electrically insulating second insulating layer has a plastic foil.

40. The electronic unit according to claim 29, wherein said electrically insulating second insulating layer is at least partially constituted by air.

41. The electronic unit according to claim 29, wherein said metal housing is configured for electrical attachment to a metal chassis.

42. The electronic unit according to claim 41, wherein the metal chassis is a metal bodywork of a motor vehicle.

* * * * *